United States Patent [19]

Buzbee

[11] 4,440,984
[45] Apr. 3, 1984

[54] METHOD OF TESTING TELEPHONE CABLE PAIRS

[76] Inventor: James M. Buzbee, 1602 NW. 5th Ave., Mineral Wells, Tex. 76067

[21] Appl. No.: 375,544

[22] Filed: May 6, 1982

[51] Int. Cl.³ .............................................. H04B 3/46
[52] U.S. Cl. .......................... 179/175.3 A; 179/175.25
[58] Field of Search .................. 179/175.3 A, 175.25, 179/175.2 B, 175.1 R, 17 A, 175.3 R

[56] References Cited
U.S. PATENT DOCUMENTS
3,975,600 8/1976 Marston ...................... 179/175.3 A Primary Examiner—Stafford D. Schreyer
Attorney, Agent, or Firm—Wm. T. Wofford; James C. Fails; Arthur F. Zobal

[57] ABSTRACT

The invention provides an improved method of testing conductor pairs in a telephone cable to determine presence or absence of a customer phone, its location relative to a cable throw or test location and the type of service. Certain types of trouble shooting tests can also be made. The improved method involves utilization of a Wheatstone bridge type connection wherein first and second legs have a common connection at one end to the central office direct current voltage source and consist respectively of a conductor of a pair in a first cable and its corresponding half tap conductor in a second cable; wherein a meter is connected between the first and second legs at the cable throw or test location; wherein a third leg comprises a customer telephone or a test pair; and wherein the fourth leg comprises either an open, or selectably either a variable resistance or a variable reactance, or both.

11 Claims, 2 Drawing Figures

METHOD OF TESTING TELEPHONE CABLE PAIRS

FIELD OF INVENTION

The invention relates to an improved method of testing conductor pairs in a telephone cable to determine for each pair to be tested whether or not a customer phone is present, and if present, its location relative to a cable throw or test location. The improved method can also accommodate additional tests and measurements.

DESCRIPTION OF THE PRIOR ART

Telephone companies often have to rearrange their cable connections in order to accommodate new customers, new construction, etc. Typically for each customer telephone involved this necessitates cutting at some point a telephone line or pair which is connected to the respective customer's telephone and reconnecting it to another pair in the same or another cable. This complete process is called a "cable throw".

In order that a customer's telephone will not be out of service for an extended period of time, it is common practice to connect the cable pair that is serving the customer's telephone (old pair) and the cable pair that will be serving the customer's telephone (new pair) together at the central office or relevant cable junction before the "cable throw" is made. Such connection is called a "half tap". The half taps are removed after the cable throw is completed.

It is common to find that errors have been made in running the half taps and also to encounter errors in records such that a customer's telephone may be connected to the old pair between the throw location and the central office instead of being connected on the field side of the splice. When this situation occurs, the customer's telephone is not in fact transferred to the new pair by completing the cable throw, and the customer's telephone service is interrupted when the half taps are later removed. Accordingly, it is very desirable for the cable splicer technician to be able to determine, at the throw location, whether or not there is a customer telephone connected to the cable pair being tested, and if so, the location of the customer's telephone relative to the cable throw location. Present techniques for doing this include the making of a bridge connection through a test set at the throw location, between the old and new cable pairs being tested. After the half taps are verified using other techniques, the old pair is cut on the central office side of the bridge connection, so that service to the customer's telephone is provided through the test set. In this test, if the customer's telephone line is busy, loop current to the customer's telephone will be on the field side of the cable throw. If the customer's telephone line is idle, use must be made of the fact that an idle telephone provides no direct current continuity either across the pair being tested or to ground, but its ringer is coupled to the pair through a large capacitor. Since the pair is idle, its connection to the central office may be completely severed. By measuring the charging current to the ringer capacitor using a battery and a meter contained in the test set, it can be determined if the customer's telephone is connected on the field side of the cable throw location and if the customer is a single party on the line (ringer across the pair) or on a two party line (ringer one side to ground for each party), etc.

Improved mechanics of making cable splices tend to make it difficult and even in some cases impractical to bridge through a test set, cut the pairs one at a time, and test for the presence and location of a customer's telephone. For example, in so called "module splicing", twenty five cable pairs are spliced from the old pairs to the new pairs and the old pairs are cut off, all in one operation, so that there is no opportunity for conventional testing.

The objective of the present invention is to provide an improved method for testing conductor pairs in a telephone cable to determine for each pair to be tested whether or not a customer's telephone is present, and if present, its location relative to the cable test location, as well as certain additional test and measurements, all without disconnecting a customer's telephone, making a bridging connection through a test set, or disconnecting the central office direct current voltage source.

SUMMARY OF THE INVENTION

The present invention provides an improved method of testing telephone cable, wherein first and second telephone cables each comprising a plurality of pairs extend from a location where half taps have been applied and over approximately equal distances to a cable throw or test location, to determine for each pair to be tested whether or not a customer phone is present, and if present, its location relative to a cable throw or test location. If a customer phone is present and idle, the type of service can also be determined. The improved method can also accommodate additional tests and measurements. All tests can be performed without disconnecting a customer phone, making a bridging connection through a test set, or disconnecting the central office direct current voltage source.

The present invention utilizes a Wheatstone bridge type connection wherein first and second legs have a common connection at one end to the central office direct current voltage source and consist respectively of a conductor of a pair in the first cable and its corresponding half tap conductor (conductor of like polarity) in the second cable; wherein a meter is connected between the first and second legs at the cable throw or test location; wherein a third leg comprises a customer telephone or a test pair; and wherein the fourth leg comprises either an open, or selectably either a variable resistance or a variable reactance, or both.

The tests to determine the presence of a customer phone and its location relative to the cable throw or test location, and the type of service, require use of only the first, second and third legs of the Wheatstone bridge type connection, the fourth leg being open. These tests also require use of shorting means and grounding means that are applied and released in a sequence and manner requisite for charging or discharging the ringer capacitor of a present customer phone and preventing unwanted meter indication. The direction of meter deflection in the case of a present customer phone is used to indicate phone location, and the presence of a sufficient meter deflection is used in the various stages of the test to determine the type of service Various tests that involve a determination of the magnitude of an impedance component or components can be carried out, utilizing the test pair as the third leg of the bridge and balancing the bridge by selectably utilizing a variable resistance or a variable reactance, or both in the fourth leg of the bridge.

DESCRIPTION OF PREFERRED EMBODIMENT

Figure 1:
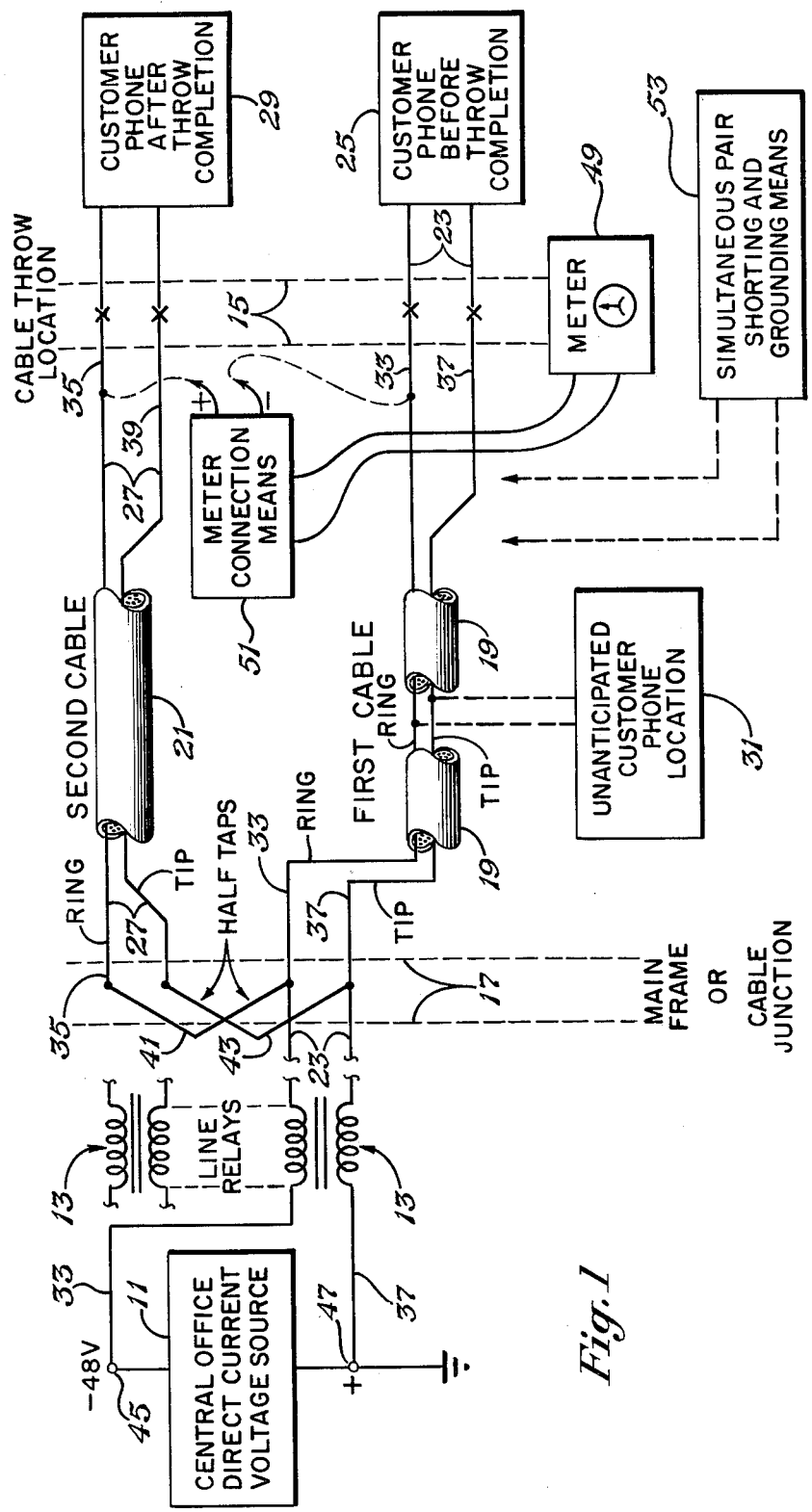
FIG. 1 is a schematic circuit diagram showing a typical situation in which the improved method of testing telephone cable pairs in accordance with a preferred embodiment of the present invention can be practiced, together with typical testing apparatus.

Referring now to FIG. 1 of the drawings, there is schematically shown a typical situation in which the improved method of testing telephone cable pairs can be practiced, together with typical testing apparatus.

The central office direct current voltage source is shown as a block 11. The usual central office line relays are indicated at 13. The location at which cable pair tests are to be performed is always a cable splice location, and the occasion for the tests is usually a cable throw operation. This location in FIG. 1 is labeled "CABLE THROW LOCATION" and is designated generally by the parallel dashed lines 15. The location at which half taps are made is usually a central office main frame, but it may be also be at a cable junction. This location is labeled "MAIN FRAME OR CABLE JUNCTION", and is designated generally by the dashed lines 17. A First Cable 19 extends from the half tap location 17 to the cable test location 15, and a Second Cable 21 also extends over approximately the same distance from the half tap location 17 to the cable test location 15.

For discussion purposes, it is assumed that a cable pair 23 from the First Cable 19 is connected to a customer telephone on the field side of the cable throw or test location 15, shown as a block 25 labeled "CUSTOMER PHONE BEFORE THROW COMPLETION"; that a cable pair 27 from the Second Cable 21 is half tapped to cable pair 23 and will be connected to the customer telephone on the field side of the cable throw location 15, shown as a block 29 labeled "CUSTOMER PHONE AFTER THROW COMPLETION"; and that cable pair 23 could possibly be connected to the customer telephone on the central office side of the cable throw location, shown as a block 31 labeled "UNANTICIPATED CUSTOMER PHONE LOCATION".

It can be noted that cable pairs 23 and 27 have a respective ring conductor 33, 35 and a respective tip conductor 37, 39. The ring conductors 33, 35 are connected by a half tap conductor 41 and the tip conductors 37, 39 are connected by a half tap conductor 43. The ring and tip conductors 33, 37 are connected through their line relay 13 respectively to the negative terminal 45 and the ground or positive terminal 47 of the central office direct current voltage source 11.

There is provided at the test location 15 a meter, shown as a block 49. The meter 49 is preferably of the zero center type and is preferably provided a sensitivity adjustment. There is also provided meter connecting means, shown as a block 51. In FIG. 1, the meter 49 is shown connected via the meter connection means 51 between the ring conductors 33, 35 of the cable pairs 23, 27. The ring conductors 33, 35 have like polarity (conventionally negative) and the tip conductors have like polarity (conventionally positive). There is also provided at the test location 15 SIMULTANEOUS PAIR SHORTING AND GROUNDING MEANS shown as a block 53, which will be connected appropriately for the test being conducted, as will be hereinafter explained.

The present invention utilizes a Wheatstone bridge type connection wherein first and second legs that have a common connection at one end to the central office direct current source consist respectively of a conductor of a pair in the First Cable and its corresponding half tap conductor in the Second Cable, wherein a meter is connected between the first and second legs at the test location, wherein a third leg comprises a customer phone, and wherein the fourth leg is open. In accordance with another aspect of the invention, a fourth leg comprises selectively either a variable resistance or a variable reactance, or both, or neither one.

Figure 2:
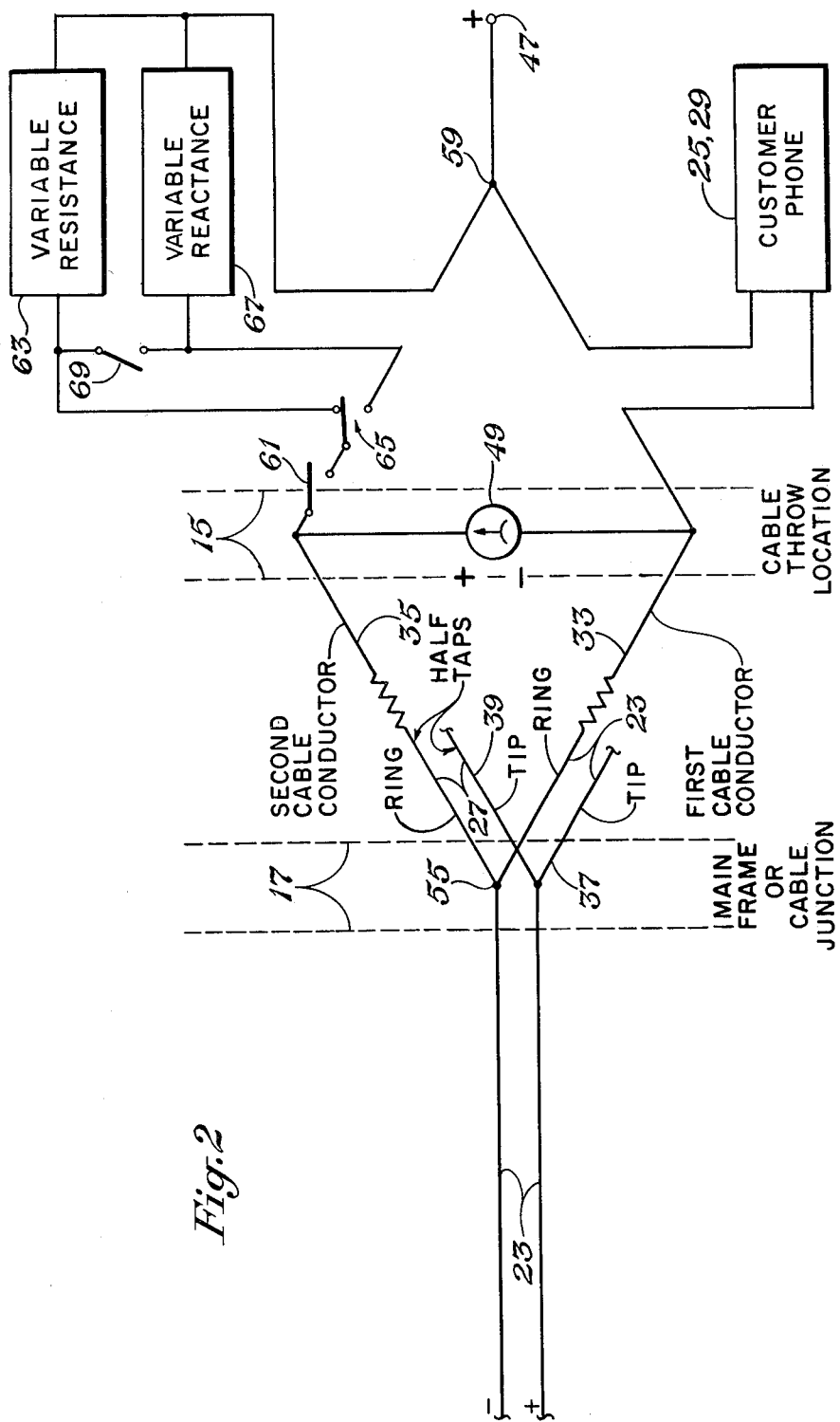
FIG. 2 is a schematic circuit diagram to aid in a further understanding of the present invention and showing typical additional testing equipment that may be utilized.

FIG. 2 is a schematic diagram which illustrates the Wheatstone bridge type connections that are utilized. In FIG. 2, where applicable, the same reference numerals are used as in FIG. 1. Again, for discussion purposes, it is assumed that a cable pair 23 from the First Cable 19 is connected to a customer telephone on the field side of the cable throw or test location 15; that a cable pair 27 from the Second Cable 21 is half tapped to the cable pair 23 and may be connected to the customer telephone on the field side of the test location 15. In FIG. 2, the ring conductors 33, 35 (which of course are conductors of like polarity) of the cable pairs 23, 27 are shown to be connected to a first common junction 55 of a Wheatstone bridge type connection at the main frame or cable Junction location 17, and the two legs that extend from the first common junction 55 to the cable throw or test location 15 (sometimes referred to herein as the first and second legs of the bridge) are the respective ring conductors 33, 35 of the respective pairs 23, 27 of the respective First and Second Cables 19, 21. The meter 49 is shown connected between the ring conductors 33, 35 at the test location 15. A customer telephone 25, 29 is shown connected as a third leg of the bridge between the junction 57 of ring conductor 33 and the meter 49, and the second common junction 59 of the bridge. The fourth leg of the bridge, which extends between the junction of the ring conductors 35 and meter 49, and the second common junction 59, may be open; thus representing an infinite resistance, as indicated for example by the presence of a single pole switch 61 when it is open. The fourth leg of the bridge may also selectively incorporate a variable resistance shown as a block 63, as indicated for example by the presence of a two position switch 65 when it is closed to the variable resistance contact side, and the single pole switch 61 is also closed. The fourth leg of the bridge may also selectively incorporate a variable reactance 67, as indicated for example when the two position switch 65 is closed to its variable reactance contact, single pole switch 61 being also closed. Further, the fourth leg of the bridge may selectively incorporate both a variable resistance 63 and a variable reactance 67, as indicated for example by the presence of a second single pole switch 69 when it is closed, with the two position switch 65 being closed to its variable resistance contact and the single pole switch 61 being closed.

The various tests that can be made in accordance with the present invention will now be discussed, with reference to FIGS. 1 and 2.

To determine whether or not a customer phone is present on the cable pair 23 being tested, and if present, whether it is connected to the First Cable 19 or the Second Cable 21, the meter 49 is connected between conductors of like polarity (in this case, ring conductors 33, 35). If no current flow is indicated by the meter 49, either a customer phone is not present or it is idle. Then the Simultaneous Pair Shorting And Grounding Means 53 is utilized to simultaneously short and ground the test pair 23. If a customer phone is present, this will discharge the ringer capacitor and when the short and ground are removed a current will flow through the meter while the ring capacitor is being recharged. The direction of this current flow will be indicated by the meter 49 and will reveal which of the cables 19, 21 the customer phone is connected to. If no current is drawn by the meter 49, then there is no customer phone present. If the customer phone is busy, then the phone will draw current, and the direction of this current flow will be indicated by the meter 49 and will reveal which of the cables 19, 21 the customer phone is connected to. In the case of a cable throw operation, after the throw has been completed the above outlined test procedure is repeated, and if the customer phone has been properly transferred, then the current flow direction will be opposite to what it was in the earlier test. If the current flow direction has not changed, then the cable splicer technician will know that the customer phone is connected on the central office side of the splice and has not been transferred, thus requiring corrective action before the half taps are removed.

If a customer phone is present and idle, then tests can be performed which will at the same time determine a phone location relative to a cable throw or test location and also whether the type of service is one party, two party one connected, or two party both connected. If the type of service is one party, the phone ringer capacitor will normally be connected between the ring and tip conductors, as shown in FIG. 1. To determine whether or not such a phone ringer capacitor is present, it is only necessary to connect the meter 49 between the ring conductors, 33, 35, then momentarily simultaneously short the ring conductors 33, 35 to prevent a meter indication and to short them to a tip conductor 37, 39 to discharge a present ringer capacitor and then immediately following release of the shorts to observe whether or not there is current flow due to recharging of a ringer capacitor as will be indicated by a sufficient deflection of the meter 49.

If the type of service is two party, then the phone ringer capacitor for the phone of one party will normally be connected between the ring conductor and ground and the ringer capacitor for the phone of the other party will normally be connected between the tip conductor and ground. To test for the presence of a ringer capacitor between the ring conductor 33 and ground the ring conductors 33, 35 are momentarily simultaneously grounded to discharge a present ringer capacitor and shorted to prevent any meter indication during the discharge and immediately following the release of the short and ground the meter is observed to see whether or not there is current flow due to recharging of the ringer capacitor as will be indicated by a sufficient deflection of the meter 49. To test for the presence of a ringer capacitor between the tip conductor 37 and ground, the meter is connected between the tip conductors 35, 37 and a short is applied between the ring conductors 33, 35 and the tip conductors 37, 39 to charge a present ringer capacitor and simultaneously a short is applied between the tip conductors 35, 37 to prevent a meter indication and then immediately following the release of the shorts the meter 49 is observed to determine whether or not there is current flow due to the discharging of the ringer capacitor as will be indicated by a sufficient deflection of the meter. If desired, instead of applying a short between the ring and tip conductors to charge a present ringer capacitor, the tip conductors may be connected to a local direct current source to accomplish the same purpose. In each case, the direction of meter deflection will reveal the location of the phone relative to the cable throw or test location. For the cases of two party service, if the phone is busy, it will draw current, and the direction of meter deflection will reveal the location of the phone, as in the case of one party service above described.

It is, of course, understood that the Simultaneous Pair Shorting and Grounding Means 53 may be utilized to apply shorts and grounds wherever and whenever they are required. It should also be understood that the Simultaneous Pair Shorting and Grounding Means 53 may apply and release the requisite shorts and grounds in a rapid repetitive manner so that an effectively continuous reading on the meter 49 may be observed instead of a momentary deflection.

The variable resistance 63 and variable reactance 67 as shown in FIG. 2 as the fourth leg of the bridge can be utilized selectively to make various tests that require measurement of the impedance presented by a test pair (which would be connected as the third leg of the bridge which is shown in FIG. 2 as including Customer Phone 25, 29) at the test location. For example, the distance to an "open" can be determined by using the variable reactance 67 (in this case primarily capacitance) together with the variable resistance 63, if needed, to balance the bridge. The capacitance required to balance the bridge will be equal to the capacitance presented by the test pair and then the distance from the test location to the "open" can be found by making a simple calculation. Also, the distance to a "short" can be determined by using the variable resistance 63, with suitable variable reactance 67, if needed, to balance the bridge. The resistance required to balance the bridge will be equal to the resistance presented by the test pair and then the distance from the test location to the "short" can be found by making a simple calculation. Also, the number of telephones at a customer location can be determined by selectively utilizing the variable reactance 67 (primarily capacitance) and the variable resistance 63, as needed, to balance the bridge. The capacitance required to balance the bridge will be approximately equal to the sum of the capacitances of the ringer capacitors of the customers telephones, so the number of such phones can be found by simple calculation. It will be apparent in view of the foregoing that any tests that involve a determination of the magnitude of an impedance component or components presented by a test pair at the test location can be carried out by utilizing the Wheatstone bridge type connection in accordance with the present invention, including the selectable variable resistance 63 and variable reactance 67.

What is claimed is:

1. An improved method of testing telephone cable; wherein first and second telephone cables each comprising a plurality of pairs extend from a location where half taps have been applied and over approximately equal distances to a cable throw or test location; wherein it is desired to determine for each pair to be tested whether or not a customer phone is present, and if present, its location relative to the cable throw or test location, all without disconnecting a customer phone, making a bridging connection through a test set, or disconnecting the central office direct current voltage source; which improved method comprises:

a. connecting a meter between conductors of like polarity of the pair being tested of the first cable and the corresponding half tap pair of the second cable and; observing the presence or absence of current flow, and if current is present, observing the direction of the current flow through the meter, thereby determining whether or not a customer phone is present and if so, whether it is connected to the first cable or to the second cable; and if a throw is completed again observing the direction of current flow through the meter, thereby determining whether or not the customer phone has been transferred and is therefore on the field side of the throw location as it should be.

2. The method of claim 1 wherein, for the case of a busy customer phone the current flow through the meter is the direct current normally drawn by a busy phone, and for the case of an idle customer phone the current flow is that due to capacitive charging or discharging of a ringer capacitor.

3. The method of claim 2 wherein for the case of an idle customer phone the test performed also determines whether the type of service is one party, two party one connected, or two party both connected, which test comprises one or more of:

a. connecting the meter between the ring conductors, then momentarily simultaneously shorting the ring conductors to prevent a meter indication and grounding them to discharge a present ringer capacitor and then immediately following the release of the short and ground observing whether or not there is current flow due to recharging of the ringer capacitor as will be indicated by a sufficient deflection of the meter;
   b. connecting the meter between the ring conductors, then momentarily grounding them to discharge a present ringer capacitor and shorting them to prevent any meter indication during the discharging and then immediately following the release of the short and ground observing whether or not there is current flow due to recharging of the ringer capacitor as will be indicated by a sufficient deflection of the meter;
   c. connecting the meter between the tip conductors, momentarily connecting the tip conductors to a direct current source to charge a present ringer capacitor while simultaneously applying a short between the tip conductors and then immediately following release of the direct current source and the short observing whether or not there is current flow due to the discharging of the ringer capacitor as will be indicated by a sufficient deflection of the meter.

4. The method of claim 3 wherein the shorting and grounding is applied and released in a rapid repetitive manner so that an effectively continuous reading on the meter 49 may be observed instead of a momentary deflection.

5. The method of claim 1 or claim 2 or claim 3 or claim 4 wherein the meter is a zero center type and there is provided a sensitivity adjustment.

6. An improved method of testing telephone cable; wherein first and second telephone cables each comprising a plurality of pairs extend from a location where half taps have been applied and over approximately equal distances to a cable throw or test location; wherein it is desired to determine for each pair to be tested whether or not a customer phone is present, and if present, its location relative to the cable throw or test location, all without disconnecting a customer phone, making a bridging connection through a test set, or disconnecting the central office direct current voltage source; which improved method comprises:

a. completing and utilizing a Wheatstone bridge type connection wherein first and second legs that have a common connection at one end to the central office direct current source consist respectively of a conductor of the pair being tested in the first cable and its corresponding half tap conductor in the second cable, wherein a meter is connected between the first and second legs at the test location, and wherein the third leg comprises a customer phone and the fourth leg is open.

7. The method of claim 6 wherein, for the case of a busy customer phone the current flow through the meter is the direct current normally drawn by a busy phone, and for the case of an idle customer phone the current flow is that due to capacitive charging or discharging of a ringer capacitor.

8. The method of claim 7 wherein for the case of an idle customer phone the test performed also determines whether the type of service is one party, two party one connected, or two party both connected, which test comprises one or more of:

a. connecting the meter between the ring conductors, then momentarily simultaneously shorting the ring conductors to prevent a meter indication and grounding them to discharge a present ringer capacitor and then immediately following the release of the short and ground observing whether or not there is current flow due to recharging of the ringer capacitor as will be indicated by a sufficient deflection of the meter;
   b. connecting the meter between the ring conductors, then momentarily grounding them to discharge a present ringer capacitor and shorting them to prevent any meter indication during the discharging and then immediately following the release of the short and ground observing whether or not there is current flow due to recharging of the ringer capacitor as will be indicated by a sufficient deflection of the meter;
   c. connecting the meter between the tip conductors, momentarily connecting the tip conductors to a direct current source to charge a present ringer capacitor while simultaneously applying a short between the tip conductors and then immediately following release of the direct current source and the short observing whether or not there is current flow due to the discharging of the ringer capacitor as will be indicated by a sufficient deflection of the meter.

9. The method of claim 8 wherein the shorting and grounding is applied and released in a rapid repetitive manner so that an effectively continuous reading on the meter 49 may be observed instead of a momentary deflection.

10. The method of claim 6 or claim 7 or claim 8 or claim 9 wherein the meter is a zero center type and there is provided a sensitivity adjustment.

11. An improved method of testing telephone cable; wherein first and second telephone cables each comprising a plurality of pairs extend from a location where half taps have been applied and over approximately equal distances to a cable test location; wherein it is desired to determine for a test pair one or more impedance components presented by the test pair at the test location, without disconnecting a customer phone, making a bridging connection through a test set, or disconnecting the central office direct current voltage source; which improved method comprises:

a. completing and utilizing a Wheatstone bridge type connection wherein first and second legs that have a common connection at one end to the central office direct current source consist respectively of a conductor of a pair in the first cable and its corresponding half tap conductor in the second cable, wherein a meter is connected between the first and second legs at the test location, wherein a third leg comprises the test pair, and wherein the fourth leg comprises selectably either a variable resistance or a variable reactance, or both.

* * * * *